(12) United States Patent
Kobayashi et al.

(10) Patent No.: US 9,907,166 B2
(45) Date of Patent: Feb. 27, 2018

(54) RESIN COMPOSITION FOR PRINTED CIRCUIT BOARD, PREPREG, RESIN COMPOSITE SHEET AND METAL FOIL CLAD LAMINATE

(71) Applicant: MITSUBISHI GAS CHEMICAL COMPANY, INC., Tokyo (JP)

(72) Inventors: Takashi Kobayashi, Tokyo (JP); Kentaro Takano, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 15/501,995

(22) PCT Filed: Feb. 19, 2016

(86) PCT No.: PCT/JP2016/054855
§ 371 (c)(1),
(2) Date: Feb. 6, 2017

(87) PCT Pub. No.: WO2016/158067
PCT Pub. Date: Oct. 6, 2016

(65) Prior Publication Data
US 2017/0238418 A1    Aug. 17, 2017

(30) Foreign Application Priority Data
Mar. 31, 2015    (JP) ................. 2015-072691

(51) Int. Cl.
| B32B 27/38 | (2006.01) |
| C08G 59/50 | (2006.01) |
| H05K 1/03 | (2006.01) |
| B32B 15/14 | (2006.01) |
| B32B 15/20 | (2006.01) |
| B32B 37/06 | (2006.01) |
| B32B 37/10 | (2006.01) |
| D06M 15/55 | (2006.01) |
| H05K 3/00 | (2006.01) |
| C08J 5/24 | (2006.01) |
| C08G 61/02 | (2006.01) |
| C08L 65/00 | (2006.01) |
| C08L 63/00 | (2006.01) |
| D06M 101/00 | (2006.01) |

(52) U.S. Cl.
CPC ........... *H05K 1/0373* (2013.01); *B32B 15/14* (2013.01); *B32B 15/20* (2013.01); *B32B 37/06* (2013.01); *B32B 37/10* (2013.01); *C08G 61/02* (2013.01); *C08J 5/24* (2013.01); *C08L 63/00* (2013.01); *C08L 65/00* (2013.01); *D06M 15/55* (2013.01); *H05K 3/007* (2013.01); *B32B 2260/021* (2013.01); *B32B 2260/046* (2013.01); *B32B 2262/101* (2013.01); *B32B 2305/076* (2013.01); *B32B 2307/202* (2013.01); *B32B 2307/206* (2013.01); *B32B 2309/02* (2013.01); *B32B 2309/12* (2013.01); *B32B 2311/12* (2013.01); *B32B 2315/085* (2013.01); *B32B 2363/00* (2013.01); *B32B 2457/08* (2013.01); *C08J 2363/00* (2013.01); *C08J 2365/00* (2013.01); *C08J 2463/00* (2013.01); *C08J 2465/00* (2013.01); *C08L 2201/02* (2013.01); *C08L 2201/08* (2013.01); *D06M 2101/00* (2013.01)

(58) Field of Classification Search
None
See application file for complete search history.

(56) References Cited

U.S. PATENT DOCUMENTS

| 4,931,545 A | 6/1990 | Shimp et al. |
| 2011/0139496 A1* | 6/2011 | Nakamura ................. B32B 7/12 174/256 |
| 2014/0113150 A1* | 4/2014 | Tang ....................... B32B 15/09 428/458 |
| 2015/0299110 A1 | 10/2015 | Katagiri et al. |
| 2016/0115271 A1 | 4/2016 | Katagiri et al. |
| 2016/0125972 A1 | 5/2016 | Arii et al. |

FOREIGN PATENT DOCUMENTS

| CA | 2 919 845 | 2/2015 |
| CN | 102911502 A * | 2/2013 |
| JP | 6-271669 | 9/1994 |
| JP | 11-124433 | 5/1999 |
| JP | 2000-191776 | 7/2000 |
| JP | 3081996 | 8/2000 |

(Continued)

OTHER PUBLICATIONS

Hong-Qiang Yan et al., "Study on the Cure Behavior of 2,7-Dihydroxynaphthalene Dicyanate", Journal of Applied Polymer Science, vol. 91; 2004; pp. 3927-3939.

(Continued)

*Primary Examiner* — Coris Fung
(74) *Attorney, Agent, or Firm* — Greenblum & Bernstein, P.L.C.

(57) ABSTRACT

The object is to provide a resin composition for a printed circuit board capable of realizing a printed circuit board that not only has heat resistance and flame retardancy but also is excellent in heat resistance after moisture absorption. The resin composition is a resin composition for a printed circuit board containing a cyanate ester compound (A) obtained by cyanation of a naphthol-dihydroxynaphthalene aralkyl resin or a dihydroxynaphthalene aralkyl resin, and an epoxy resin (B).

11 Claims, No Drawings

(56) References Cited

FOREIGN PATENT DOCUMENTS

| | | |
|---|---|---|
| JP | 2014-166613 | 9/2014 |
| WO | 2014/065422 | 5/2014 |
| WO | 2014/203865 | 12/2014 |
| WO | 2014/203866 | 12/2014 |
| WO | 2015/021086 | 2/2015 |

OTHER PUBLICATIONS

International Search Report issued in Patent Application No. PCT/JP2016/054855, dated Apr. 12, 2016.

* cited by examiner

RESIN COMPOSITION FOR PRINTED CIRCUIT BOARD, PREPREG, RESIN COMPOSITE SHEET AND METAL FOIL CLAD LAMINATE

TECHNICAL FIELD

The present invention relates to a resin composition for a printed circuit board and a prepreg, and also relates to a resin composite sheet, a metal foil clad laminate and a printed circuit board using the resin composition and/or the prepreg.

BACKGROUND ART

Recently, high integration and miniaturization of semiconductors widely used in electronic equipment, communication devices, personal computers and the like have been more and more rapidly progressed. Under such circumstances, various characteristics required of a laminate for a semiconductor package to be included in a printed circuit board have become more and more severe. The required characteristics are characteristics such as low water absorption, heat resistance after moisture absorption, flame retardancy, a low dielectric constant, a low dielectric loss tangent, a small coefficient of thermal expansion, heat resistance and chemical resistance. These characteristic requirements have been, however, not necessarily satisfied yet.

Cyanate ester compounds have been conventionally known as resins for a printed circuit board having excellent heat resistance and electric characteristics, and resin compositions using a bisphenol A-based cyanate ester compound and another thermosetting resin or the like have been widely used as, for example, materials of printed circuit boards. A bisphenol A-based cyanate ester compound is excellent in the electric characteristic, mechanical characteristic, chemical resistance characteristic and the like. The cyanate ester compound is, however, sometimes insufficient in low water absorption, heat resistance after moisture absorption, flame retardancy and heat resistance. Therefore, for purpose of further improving various characteristics, examinations have been made on a variety of cyanate ester compounds having different structures.

As a resin having a different structure from the bisphenol A-based cyanate ester compound, for example, a novolac-based cyanate ester compound is often used (see Patent Document 1). The novolac-based cyanate ester compound has, however, the following problems: the compound is liable to be insufficiently cured, and a resultant cured product has high water absorption, which results in low heat resistance after moisture absorption. Therefore, as a method for solving these problems, prepolymerization of a novolac-based cyanate ester compound and a bisphenol A-based cyanate ester compound has been proposed (see Patent Document 2).

Besides, as a method for improving the flame retardancy, it has been proposed that a halogen-based compound is contained in a resin composition by, for example, using a fluorinated cyanate ester compound, or mixing or prepolymerizing a cyanate ester compound with the halogen-based compound (see Patent Documents 3 and 4).

CITATION LIST

Patent Document

Patent Document 1: Japanese Patent Application Laid-Open No. 11-124433

Patent Document 2: Japanese Patent Application Laid-Open No. 2000-191776

Patent Document 3: Japanese Patent No. 3081996

Patent Document 4: Japanese Patent Application Laid-Open No. 6-271669

SUMMARY OF INVENTION

Although the prepolymerization described in Patent Document 2 improves the curing property, the characteristic improvement in the low water absorption, the heat resistance after moisture absorption and the heat resistance has not been sufficiently attained yet. Therefore, there is a need for further improvement of a cyanate ester compound in the low water absorption, the heat resistance after moisture absorption and the heat resistance. Besides, according to the techniques described in Patent Documents 3 and 4, if a halogen-based compound is used, it is apprehended that a toxic substance such as dioxin is generated during burning. Therefore, it is desired to improve the flame retardancy of the resin composition without using a halogen-based compound.

The present invention has been accomplished in consideration of the aforementioned situations, and an object of the present invention is to provide a resin composition for a printed circuit board capable of realizing a printed circuit board that is excellent not only in heat resistance and flame retardancy but also in heat resistance after moisture absorption, a prepreg and a resin composite sheet using the resin composition, and a metal foil clad laminate and a printed circuit board using the prepreg.

Solution to Problems

As a result of earnest studies on the above-described problems, the present inventors have found that when a resin composition containing a cyanate ester compound obtained by cyanation of a prescribed resin is used for a printed circuit board, excellent heat resistance and flame retardancy can be realized while improving heat resistance after moisture absorption, and thus, the present invention was accomplished. Specifically, the present invention provides the following:

[1] A resin composition for a printed circuit board, comprising a cyanate ester compound (A) having at least one structure selected from the group consisting of structures represented by the following formula (1), the following formula (2) and the following formula (8), and an epoxy resin (B):

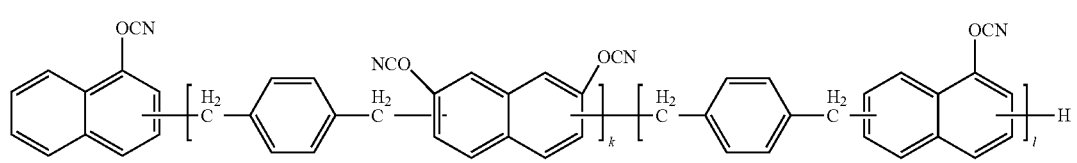

wherein k represents an integer of 1 or more, and l represents an integer of 0 or more, the cyanate ester compound optionally being a mixture of compounds different in k and l, and arrangement of repeating units being arbitrary,

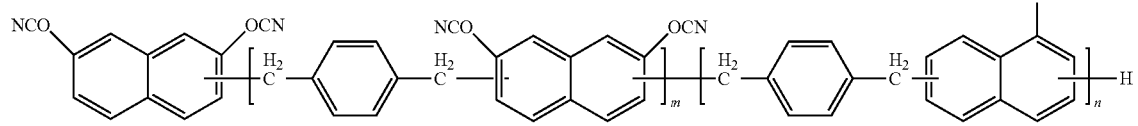

wherein m and n each represent an integer of 0 or more, at least one of m and n being 1 or more, the cyanate ester compound optionally being a mixture of compounds different in m and n, and arrangement of repeating units being arbitrary, and

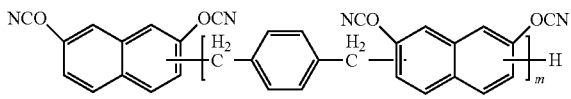

wherein m represents an integer of 0 or more, and the cyanate ester compound optionally being a mixture of compounds different in m.

[2] A resin composition for a printed circuit board, comprising a cyanate ester compound (A) obtained by cyanation of at least one resin selected from the group consisting of naphthol-dihydroxynaphthalene aralkyl resins and dihydroxynaphthalene aralkyl resins, and an epoxy resin (B).

[3] The resin composition for a printed circuit board according to [1], wherein the cyanate ester compound (A) is one obtained by cyanation of at least one resin selected from the group consisting of naphthol-dihydroxynaphthalene aralkyl resins and dihydroxynaphthalene aralkyl resins.

[4] The resin composition for a printed circuit board according to any one of [1] to [3], wherein a content of the cyanate ester compound (A) is 1 to 90 parts by mass based on 100 parts by mass of a solid component of resins contained in the resin composition.

[5] The resin composition for a printed circuit board according to any one of [1] to [4], further comprising a filler (C).

[6] The resin composition for a printed circuit board according to [5], wherein a content of the filler (C) is 50 to 1600 parts by mass based on 100 parts by mass of a solid component of resins contained in the resin composition.

[7] The resin composition for a printed circuit board according to any one of [1] to [6], further comprising at least one selected from the group consisting of a cyanate ester compound other than the cyanate ester compound (A), maleimide compounds and phenolic resins.

[8] The resin composition for a printed circuit board according to any one of [1] to [7], wherein the epoxy resin (B) is at least one selected from the group consisting of biphenyl aralkyl-based epoxy resins, naphthylene ether-based epoxy resins, polyfunctional phenol-based epoxy resins and naphthalene-based epoxy resins.

[9] A prepreg comprising:
a substrate; and
the resin composition for a printed circuit board according to any one of [1] to [8] impregnated into or applied to the substrate.

[10] A metal foil clad laminate comprising:
a stack of at least one prepreg according to [9] stacked; and
a metal foil disposed on one surface or both surfaces of the prepreg.

[11] A resin composite sheet comprising:
a support; and
the resin composition for a printed circuit board according to any one of [1] to [8] disposed on a surface of the support.

[12] A printed circuit board comprising an insulating layer and a conductive layer formed on a surface of the insulating layer,
wherein the insulating layer contains the resin composition for a printed circuit board according to any one of [1] to [8].

Advantageous Effects of Invention

According to the present invention, there can be provided a resin composition for a printed circuit board capable of realizing a printed circuit board that is excellent not only in heat resistance and flame retardancy but also in heat resistance after moisture absorption, a prepreg and a resin composite sheet using the resin composition, and a metal foil clad laminate and a printed circuit board using the prepreg.

DESCRIPTION OF EMBODIMENT

Now, a preferred embodiment for practicing the present invention (hereinafter simply referred to as the "present embodiment") will be described in detail. It is noted that the present embodiment described below is merely illustrative and does not limit the present invention.

A resin composition for a printed circuit board (hereinafter sometimes simply referred to as the "resin composition") of the present embodiment contains a cyanate ester compound (A) obtained by cyanation of at least one resin selected from the group consisting of naphthol-dihydroxynaphthalene aralkyl resins and dihydroxynaphthalene aralkyl resins (hereinafter sometimes comprehensively designated as the "naphthol-dihydroxynaphthalene aralkyl resins and the like"), and an epoxy resin (B).

The cyanate ester compound (A) used in the present embodiment is obtained by cyanation of any of the naphthol-dihydroxynaphthalene aralkyl resins and the like.

The cyanate ester compound (A) used in the present embodiment may have at least one structure selected from structures represented by the following formulas (1), (2) and (8), and these structures are preferred.

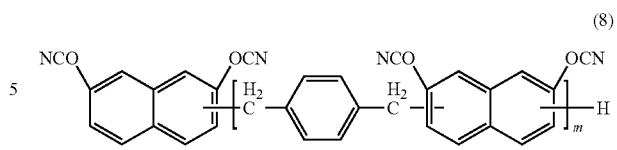
(8)

wherein m represents an integer of 0 or more. A mixture of compounds different in m may also be employed. Although the upper limit of m is not especially limited, m is preferably 20 or less from the viewpoint of effectively and definitely attaining the effects of the present invention.

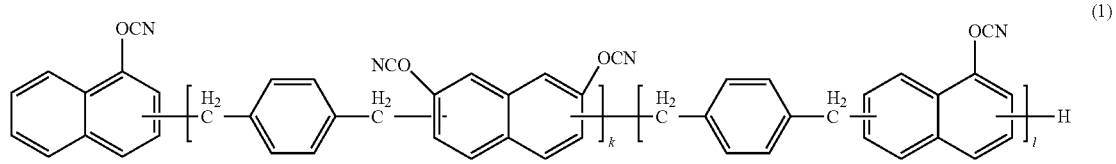
(1)

wherein k represents an integer of 1 or more, and l represents an integer of 0 or more. A mixture of compounds different in k and l may also be employed. The arrangement of repeating units is arbitrary. Although the upper limit of k is not especially limited, k is preferably 20 or less from the viewpoint of effectively and definitely attaining the effects of the present invention. From a similar viewpoint, l is preferably 20 or less.

A weight average molecular weight Mw of the cyanate ester compound (A) of the present embodiment is not especially limited, and is preferably 100 to 5000, more preferably 200 to 3500, and further preferably 200 to 3000. The weight average molecular weight Mw is measured by a method described in an example below.

A cured product of the resin composition containing the cyanate ester compound having such a structure attains

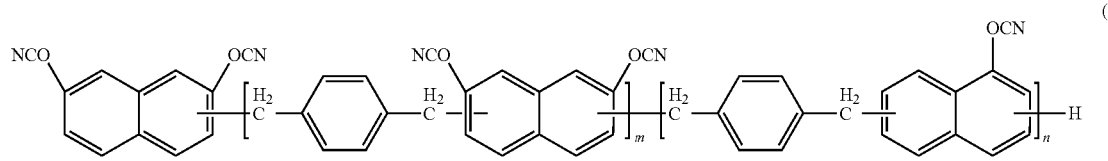
(2)

wherein m and n each represent an integer of 0 or more, with at least one of m and n representing 1 or more. A mixture of compounds different in m and n may also be employed. The arrangement of repeating units is arbitrary. Although the upper limit of m is not especially limited, m is preferably 20 or less from the viewpoint of effectively and definitely attaining the effects of the present invention. From a similar viewpoint, n is preferably 20 or less.

excellent heat resistance and flame retardancy, and has improved heat resistance after moisture absorption.

A method for obtaining the cyanate ester compound (A) of the present embodiment is not especially limited, and for example, a method including cyanation of a hydroxy group of the naphthol-dihydroxynaphthalene aralkyl resins and the like having at least one structure selected from structures represented by following formulas (3), (4) and (9) can be employed.

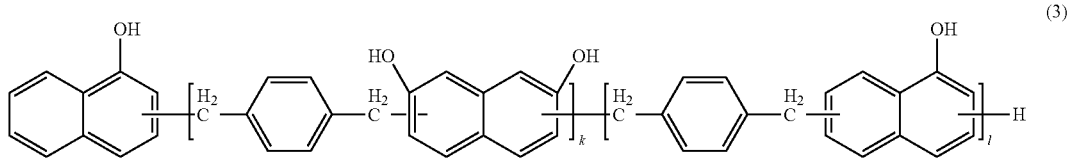

(3)

wherein k represents an integer of 1 or more, and l represents an integer of 0 or more. A mixture of compounds different in k and l may also be employed. The arrangement of repeating units is arbitrary.

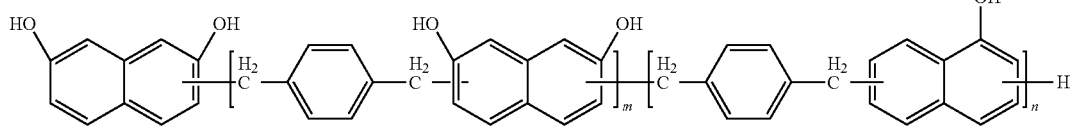

(4)

wherein m and n each represent an integer of 0 or more, with at least one of m and n representing 1 or more. A mixture of compounds different in m and n may also be employed. The arrangement of repeating units is arbitrary.

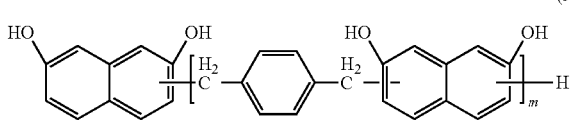

(9)

wherein m represents an integer of 0 to 20. A mixture of compounds different in m may also be employed.

A cyanation method for the hydroxy group of the resin having at least one structure selected from the group consisting of the structures represented by formulas (3), (4) and (9) is not especially limited, and any of known methods may be employed. An example of the method includes a method in which a hydroxy group-containing compound having a desired skeleton is obtained or synthesized, and cyanate the hydroxyl group through modification by a known method. As a cyanation method for a hydroxyl group, for example, a method described in Ian Hamerton, "Chemistry and Technology of Cyanate Ester Resins," Blackie Academic & Professional may be employed.

The content of the cyanate ester compound (A) thus obtained in the resin composition of the present embodiment is not especially limited but can be appropriately set in accordance with desired characteristics. The content of the cyanate ester compound (A) is preferably 1 to 90 parts by mass, more preferably 10 to 80 parts by mass, further preferably 20 to 75 parts by mass, and particularly preferably 30 to 70 parts by mass based on 100 parts by mass of a solid content of resins contained in the resin composition. Here, the "solid content of resins contained in the resin composition" refers, unless otherwise mentioned, to components excluding a solvent and a filler (C) of the resin composition, and 100 parts by mass of the solid content of resins means that the total content of the components excluding the solvent and the filler of the resin composition is 100 parts by mass. If the content of the cyanate ester compound (A) falls in the above-described range, the cured product of the resin composition tends to be excellent in the flame retardancy, the heat resistance and the heat resistance after moisture absorption.

As the epoxy resin (B) of the present embodiment, any of known epoxy resins may be appropriately used as long as it contains 2 or more epoxy groups in one molecule thereof, and the type of the epoxy resin is not especially limited. Specific examples of the epoxy resin (B) include bisphenol A-based epoxy resins, bisphenol E-based epoxy resins, bisphenol F-based epoxy resins, bisphenol S-based epoxy resins, phenol novolac-based epoxy resins, bisphenol A novolac-based epoxy resins, glycidyl ester-based epoxy resins, triglycidyl isocyanurate, aralkyl novolac-based epoxy resins, biphenyl aralkyl-based epoxy resins, naphthylene ether-based epoxy resins, cresol novolac-based epoxy resins, xylene novolac-based epoxy resins, dicyclopentadiene novolac-based epoxy resins, biphenyl novolac-based epoxy resins, phenol aralkyl novolac-based epoxy resins, naphthol aralkyl novolac-based epoxy resins, polyfunctional phenol-based epoxy resins, naphthalene-based epoxy resins, anthracene-based epoxy resins, naphthalene skeleton-modified novolac-based epoxy resins, phenol aralkyl-based epoxy resins, naphthol aralkyl-based epoxy resins, dicyclopentadiene-based epoxy resins, biphenyl-based epoxy resins, alicyclic epoxy resins, polyol-based epoxy resins, phosphorus-containing epoxy resins, a compound obtained by epoxidation of a double bond of glycidyl amine, glycidyl ester, butadiene or the like, and a compound obtained by a reaction between a hydroxyl group-containing silicone resin and epichlorohydrin. Among these epoxy resins, the biphenyl aralkyl-based epoxy resins, the naphthylene ether-based epoxy resins, polyfunctional phenol-based epoxy resins and naphthalene-based epoxy resins are preferably used from the viewpoint of the flame retardancy and the heat resistance. One of these epoxy resins may be singly used, or two or more of these may be used in an appropriate combination.

The content of the epoxy resin (B) of the present embodiment is not especially limited but can be appropriately set in accordance with the desired characteristics, and is preferably 10 to 99 parts by mass, more preferably 20 to 90 parts by mass, further preferably 25 to 80 parts by mass, and particularly preferably 30 to 70 parts by mass based on 100 parts by mass of the solid content of resins contained in the resin composition.

The resin composition of the present embodiment may optionally contain the filler (C). Any of known fillers may be appropriately used as the filler (C), and the type is not especially limited. In particular, fillers generally used in application to laminates can be suitably used as the filler (C). Specific examples of the filler (C) include silicas such as natural silica, fused silica, synthetic silica, amorphous silica, aerosil and hollow silica; oxides such as white carbon, titanium white, zinc oxide, magnesium oxide and zirconium oxide; nitrides such as boron nitride, aggregated boron nitride, silicon nitride and carbon nitride; carbides such as silicon carbide; titanates such as strontium titanate and barium titanate; aluminum nitride; sulfates and sulfites such as barium sulfate, calcium sulfate and calcium sulfite; metal hydroxides such as aluminum hydroxide, heat-treated products of aluminum hydroxide (a substance obtained by heating aluminum hydroxide for partially decreasing crystallization water), magnesium hydroxide and calcium hydroxide; molybdenum compounds such as molybdenum oxide and zinc molybdate; carbonates such as calcium carbonate, magnesium carbonate and hydrotalcite; borates such as zinc borate, barium metaborate, aluminum borate, calcium borate and sodium borate; inorganic fillers such as zinc stannate, alumina, gibbsite, boehmite, clay, kaolin, talc, calcined clay, calcined kaolin, calcined talc, mica, E-glass, A-glass, NE-glass, C-glass, L-glass, D-glass, S-glass, M-glass G20 and short glass fibers (including a fine glass powder of E-glass, T-glass, D-glass, S-glass, Q-glass or the like), hollow glass and spherical glass; and organic fillers such as styrene-based, butadiene-based and acrylic-based rubber powders, core-shell rubber powders, silicone resin powders, silicone rubber powders, and silicone composite powders. One of these fillers may be singly used, or two or more of these may be used in an appropriate combination.

The content of the filler (C) of the present embodiment is not especially limited but can be appropriately set in accordance with the desired characteristics, and it is preferably 50 to 1600 parts by mass, more preferably 60 to 1000 parts by mass, further preferably 70 to 500 parts by mass, and particularly preferably 80 to 200 parts by mass based on 100 parts by mass of the solid content of resins contained in the resin composition. If the content of the filler (C) falls in the above-described range, the cured product of the resin composition tends to be more excellent in the flame retardancy, the heat resistance and the heat resistance after moisture absorption.

If an inorganic filler (C) is to be contained in the resin composition, a silane coupling agent or a wetting and dispersing agent is preferably used together. As the silane coupling agent, any of those generally used for a surface treatment of an inorganic substance can be suitably used, and the type is not especially limited. Specific examples of the silane coupling agent include amino silane-based agents such as γ-aminopropyltriethoxysilane and N-β-(aminoethyl)-γ-aminopropyltrimethoxysilane, epoxy silane-based agents such as γ-glycidoxypropyltrimethoxysilane and β-(3,4-epoxycyclohexyl)ethyltrimethoxysilane, vinyl silane-based agents such as γ-methacryloxypropyltrimethoxysilane and vinyl-tri(β-methoxyethoxy)silane, cationic silane-based agents such as N-β-(N-vinylbenzylaminoethyl)-γ-aminopropyltrimethoxysilane hydrochloride, and phenyl silane-based agents. One of these silane coupling agents may be singly used, or two or more of these may be used in an appropriate combination. Besides, as the wetting and dispersing agent, any of those generally used for coating can be suitably used, and the type is not especially limited. The wetting and dispersing agent is preferably a copolymer-based wetting and dispersing agent, and may be a commercially available product. Specific examples of the commercially available product include Disperbyk-110, 111, 161, 180, BYK-W996, BYK-W9010, BYK-W903 and BYL-W940 (all product names) manufactured by BYK Japan KK. One of these wetting and dispersing agents may be singly used, or two or more of these may be used in an appropriate combination.

Besides, the resin composition of the present embodiment may optionally contain a curing accelerator for appropriately controlling a curing rate if necessary. Any of those generally used as a curing accelerator for a cyanate ester compound, an epoxy resin and the like can be suitably used as the curing accelerator, and the type is not especially limited. Specific examples of the curing accelerator include organic metal salts such as zinc octylate, zinc naphthenate, cobalt naphthenate, copper naphthenate, iron acetylacetonate, nickel octylate and manganese octylate; phenolic compounds such as phenol, xylenol, cresol, resorcin, catechol, octylphenol and nonylphenol; alcohols such as 1-butanol and 2-ethylhexanol; imidazoles such as 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole and 2-phenyl-4-methyl-5-hydroxymethylimidazole, and derivatives of these imidazoles such as carboxylic acid or anhydride adducts thereof; amines such as dicyandiamide, benzyldimethylamine and 4-methyl-N,N-dimethylbenzylamine; phosphorus compounds such as phosphine-based compounds, phosphine oxide-based compounds, phosphonium salt-based compounds and diphosphine compounds; epoxy-imidazole adduct-based compounds; peroxides such as benzoyl peroxide, p-chlorobenzoyl peroxide, di-t-butyl peroxide, diisopropyl peroxycarbonate and di-2-ethylhexyl peroxycarbonate; and azo compounds such as azobisisobutyronitrile. Such a curing accelerator (a polymerization catalyst) may be a commercially available product, and examples of the commercially available product include Amicure PN-23 (product name, manufactured by Ajinomoto Fine-Techno Co., Inc.), Novacure HX-3721 (product name, manufactured by Asahi Kasei Advance Corporation) and Fujicure FX-1000 (product name, manufactured by Fuji Kasei Co., Ltd.). One of these curing accelerators may be singly used, or two or more of these may be used in an appropriate combination.

The amount of the curing accelerator to be used is not especially limited but can be appropriately adjusted in consideration of the curing degree of the resin, the viscosity of the resin composition and the like. The amount of the curing accelerator to be used may be 0.005 to 10 parts by mass based on 100 parts by mass of the solid content of resins contained in the resin composition.

The resin composition of the present embodiment may further contain at least one selected from the group consisting of a cyanate ester compound other than the cyanate ester compound (A) (hereinafter referred to as the "different cyanate ester compound"), a maleimide compound and a phenolic resin as long as the desired characteristics are not impaired.

The different cyanate ester compound is not especially limited as long as it is a resin having, in a molecule thereof, an aromatic moiety substituted with at least one cyanate group. An example of the different cyanate ester compound includes one represented by the following formula (5):

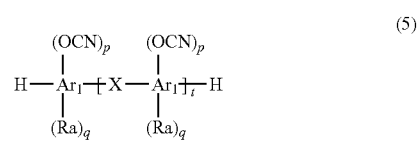

Ar₁ represents a benzene ring, a naphthalene ring or a single bond of two benzene rings, and plural Ar₁s may be the same as or different from each other. Ra independently represents a hydrogen atom, an alkyl group having 1 to 6 carbon atoms, an aryl group having 6 to 12 carbon atoms, an alkoxy group having 1 to 4 carbon atoms, or a group formed by bonding an alkyl group having 1 to 6 carbon atoms and an aryl group having 6 to 12 carbon atoms to each other. An aromatic ring of Ra may have a substituent, and each substituent of Ar₁ and Ra may be at an arbitrarily selected position. Besides, p represents the number of cyanato groups bonded to Ar₁, and independently represents an integer of 1 to 3. Furthermore, q represents the number of Ras bonded to Ar₁; q is 4-p if Ar₁ is a benzene ring; q is 6-p if Ar₁ is a naphthalene ring; and q is 8-p if Ar₁ is a single bond of two benzene rings. Besides, t represents an average repeating number, and is an integer of 0 to 50, and the different cyanate ester compound may be a mixture of compounds different in t. Moreover, X represents, if there are plural, independently any one of a single bond, a bivalent organic group having 1 to 50 carbon atoms (in which a hydrogen atom may be substituted with a hetero atom), a bivalent organic group having 1 to 10 nitrogen atoms (such as —N—R—N— (wherein R represents an organic group)), a carbonyl group (—CO—), a carboxyl group (—C(=O)O—), a carbonyl dioxide group (—OC(=O)O—), a sulfonyl group (—SO₂—), a bivalent sulfur atom and a bivalent oxygen atom.

The alkyl group represented by Ra in formula (5) may optionally have any of a straight or branched chain structure and a cyclic structure (such as a cycloalkyl group). Besides, a hydrogen atom contained in the alkyl group or the aryl group represented by Ra in formula (5) may be substituted with a halogen atom such as a fluorine atom or a chlorine atom, an alkoxy group such as a methoxy group or a phenoxy group, a cyano group or the like.

Specific examples of the alkyl group include a methyl group, an ethyl group, a propyl group, an isopropyl group, an n-butyl group, an isobutyl group, a tert-butyl group, an n-pentyl group, a 1-ethylpropyl group, a 2,2-dimethylpropyl group, a cyclopentyl group, a hexyl group, a cyclohexyl group and a trifluoromethyl group.

Specific examples of the aryl group include a phenyl group, a xylyl group, a mesityl group, a naphthyl group, a phenoxyphenyl group, an ethyl phenyl group, an o-, m- or p-fluorophenyl group, a dichlorophenyl group, a dicyanophenyl group, a trifluorophenyl group, a methoxyphenyl group, and o-, m- or p-tolyl group. Examples of the alkoxy group include a methoxy group, an ethoxy group, a propoxy group, an isopropoxy group, an n-butoxy group, an isobutoxy group and a tert-butoxy group.

Specific examples of the bivalent organic group having 1 to 50 carbon atoms represented by X in formula (5) include alkylene groups such as a methylene group, an ethylene group, a trimethylene group and a propylene group, cycloalkylene groups such as a cyclopentylene group, a cyclohexylene group and a trimethylcyclohexylene group, and bivalent organic groups having an aromatic ring such as a biphenylyl methylene group, a dimethylmethylene-phenylene-dimethylmethylene group, a fluorenediyl group and a phthalide-diyl group. A hydrogen atom contained in the bivalent organic group may be substituted with a halogen atom such as a fluorine atom or a chlorine atom, an alkoxy group such as a methoxy group or a phenoxy group, a cyano group or the like.

Examples of the bivalent organic group having 1 to 10 nitrogen atoms represented by X in formula (5) include a group represented by —N—R—N—, an imino group and a polyimide group.

Examples of the organic group represented by X in formula (5) include groups having structures respectively represented by the following formulas (6) and (7).

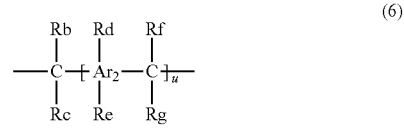

Ar₂ represents a benzenetetrayl group, a naphthalenetetrayl group or a biphenyltetrayl group, and if u is 2 or more, plural Ar₂s may be the same as or different from each other. Rb, Rc, Rf and Rg each independently represent a hydrogen atom, an alkyl group having 1 to 6 carbon atoms, an aryl group having 6 to 12 carbon atoms, a trifluoromethyl group or an aryl group having at least one phenolic hydroxy group. Rd and Re each independently represent a hydrogen atom, an alkyl group having 1 to 6 carbon atoms, an aryl group having 6 to 12 carbon atoms, an alkoxy group having 1 to 4 carbon atoms or a hydroxy group. Besides, u represents an integer of 0 to 5.

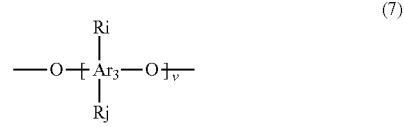

Ar₃ represents a benzenetetrayl group, a naphthalenetetrayl group or a biphenyltetrayl group, and if v is 2 or more, plural Ar₃s may be the same as or different from each other. Ri and Rj each independently represent a hydrogen atom, an alkyl group having 1 to 6 carbon atoms, an aryl group having 6 to 12 carbon atoms, a benzyl group, an alkoxy group having 1 to 4 carbon atoms, a hydroxy group, a trifluoromethyl group, or an aryl group having at least one cyanato group substituted. Besides, v represents an integer of 0 to 5, and this structure may be a mixture of compounds different in v.

Examples of X in formula (5) include bivalent groups represented by the following formula:

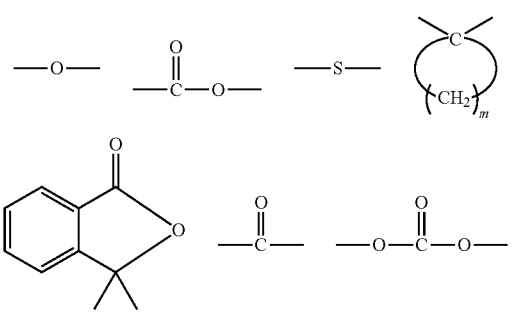

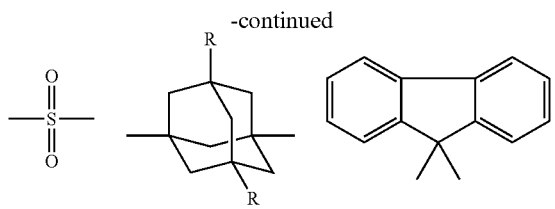

wherein m represents an integer of 4 to 7; and R independently represents a hydrogen atom or an alkyl group having 1 to 6 carbon atoms.

Specific examples of $Ar_2$ in formula (6) and $Ar_3$ in formula (7) include a benzenetetrayl group in which two carbon atoms in formula (6) or two oxygen atoms in formula (7) are bonded to the 1- and 4-positions or 1- and 3-positions, a biphenyltetrayl group in which the two carbon atoms or the two oxygen atoms are bonded to the 4- and 4'-positions, 2- and 4'-positions, 2- and 2'-positions, 2- and 3'-positions, 3- and 3'-positions, or 3- and 4'-positions, and a naphthalenetetrayl group in which the two carbon atoms or the two oxygen atoms are bonded to the 2- and 6-positions, 1- and 5-positions, 1- and 6-positions, 1- and 8-positions, 1- and 3-positions, 1- and 4-positions or 2- and 7-positions.

The alkyl group and the aryl group represented by Rb, Rc, Rd, Re, Rf or Rg in formula (6) and Ri or Rj in formula (7) are defined in the same manner as those in formula (5).

Specific examples of the resin having, in a molecule thereof, an aromatic moiety substituted with at least one cyanato group represented by formula (5) include cyanatobenzene, 1-cyanato-2-, 1-cyanato-3- or 1-cyanato-4-methylbenzene, 1-cyanato-2-, 1-cyanato-3- or 1-cyanato-4-methoxybenzene, 1-cyanato-2,3-, 1-cyanato-2,4-1-cyanato-2,5-, 1-cyanato-2,6-, 1-cyanato-3,4- or 1-cyanato-3,5-dimethylbenzene, cyanatoethylbenzene, cyanatobutylbenzene, cyanatooctylbenzene, cyanatononylbenzene, 2-(4-cyanaphenyl)-2-phenylpropane (cyanate of 4-α-cumylphenol), 1-cyanato-4-cyclohexylbenzene, 1-cyanato-4-vinylbenzene, 1-cyanato-2- or 1-cyanato-3-chlorobenzene, 1-cyanato-2,6-dichlorobenzene, 1-cyanato-2-methyl-3-chlorobenzene, cyanatonitrobenzene, 1-cyanato-4-nitro-2-ethylbenzene, 1-cyanato-2-methoxy-4-allylbenzene (cyanate of eugenol), methyl (4-cyanatophenyl)sulfide, 1-cyanato-3-trifluoromethylbenzene, 4-cyanatobiphenyl, 1-cyanato-2- or 1-cyanato-4-acetylbenzene, 4-cyanatobenzaldehyde, 4-cyanatobenzoic acid methyl ester, 4-cyanatobenzoic acid phenyl ester, 1-cyanato-4-acetoaminobenzene, 4-cyanatobenzophenone, 1-cyanato-2,6-di-tert-butylbenzene, 1,2-dicyanatobenzene, 1,3-dicyanatobenzene, 1,4-dicyanatobenzene, 1,4-dicyanato-2-tert-butylbenzene, 1,4-dicyanato-2,4-dimethylbenzene, 1,4-dicyanato-2,3,4-trimethylbenzene, 1,3-dicyanato-2,4,6-trimethylbenzene, 1,3-dicyanato-5-methylbenzene, 1-cyanato or 2-cyanatonapththalene, 1-cyanato-4-methoxynaphthalene, 2-cyanato-6-methylnaphthalene, 2-cyanato-7-methoxynaphthalene, 2,2-dicyanato-1,1-binaphthyl, 1,3-, 1,4-, 1,5-, 1,6-, 1,7-, 2,3-, 2,6- or 2,7-dicyanatonaphthalene, 2,2- or 4,4-dicyanatobiphenyl, 4,4-dicyanatooctafluorobiphenyl, 2,4- or 4,4-dicyanatodiphenylmethane, bis(4-cyanato-3,5-dimethylphenyl)methane, 1,1-bis(4-cyanatophenyl)ethane, 1,1-bis(4-cyanatophenyl)propane, 2,2-bis(4-cyanatophenyl)propane, 2,2-bis(4-cyanato-3-methylphenyl)propane, 2,2-bis(2-cyanato-5-biphenylyl)propane, 2,2-bis(4-cyanatophenyl)hexafluoropropane, 2,2-bis(4-cyanato-3,5-dimethylphenyl)propane, 1,1-bis(4-cyanatophenyl)butane, 1,1-bis(4-cyanatophenyl)isobutane, 1,1-bis(4-cyanatophenyl)pentane, 1,1-bis(4-cyanatophenyl)-3-methylbutane, 1,1-bis(4-cyanatophenyl)-2-methylbutane, 1,1-bis(4-cyanatophenyl)-2,2-dimethylpropane, 2,2-bis(4-cyanatophenyl) butane, 2,2-bis(4-cyanatophenyl)pentane, 2,2-bis(4-cyanatophenyl)hexane, 2,2-bis(4-cyanatophenyl)-3-methylbutane, 2,2-bis(4-cyanatophenyl)-4-methylpentane, 2,2-bis(4-cyanatophenyl)-3,3-dimethylbutane, 3,3-bis(4-cyanatophenyl)hexane, 3,3-bis(4-cyanatophenyl)heptane, 3,3-bis(4-cyanatophenyl)octane, 3,3-bis(4-cyanatophenyl)-2-methylpentane, 3,3-bis(4-cyanatophenyl)-2-methylhexane, 3,3-bis(4-cyanatophenyl)-2,2-dimethylpentane, 4,4-bis(4-cyanatophenyl)-3-methylheptane, 3,3-bis(4-cyanatophenyl)-2-methylheptane, 3,3-bis(4-cyanatophenyl)-2,2-dimethylhexane, 3,3-bis(4-cyanatophenyl)-2,4-dimethylhexane, 3,3-bis(4-cyanatophenyl)-2,2,4-trimethylpentane, 2,2-bis(4-cyanatophenyl)-1,1,1,3,3,3-hexafluoropropane, bis(4-cyanatophenyl)phenylmethane, 1,1-bis(4-cyanatophenyl)-1-phenylethane, bis(4-cyanatophenyl)biphenylmethane, 1,1-bis(4-cyanatophenyl)cyclopentane, 1,1-bis(4-cyanatophenyl)cyclohexane, 2,2-bis(4-cyanato-3-isopropylphenyl)propane, 1,1-bis(3-cyclohexyl-4-cyanatophenyl)cyclohexane, bis(4-cyanatophenyl)diphenylmethane, bis(4-cyanatophenyl)-2,2-dichloroethylene, 1,3-bis[2-(4-cyanatophenyl)-2-propyl]benzene, 1,4-bis[2-(4-cyanatophenyl)-2-propyl]benzene, 1,1-bis(4-cyanatophenyl)-3,3,5-trimethylcyclohexane, 4-[bis(4-cyanatophenyl)methyl]biphenyl, 4,4-dicyanatobenzophenone, 1,3-bis(4-cyanatophenyl)-2-propene-1-one, bis (4-cyanatophenyl)ether, bis(4-cyanatophenyl)sulfide, bis(4-cyanatophenyl)sulfone, 4-cyanatobenzoic acid-4-cyanatophenylester (4-cyanatophenyl-4-cyanatobenzoate), bis-(4-cyanatophenyl)carbonate, 1,3-bis(4-cyanatophenyl) adamantane, 1,3-bis(4-cyanatophenyl)-5,7-dimethyladamantane, 3,3-bis(4-cyanatophenyl)isobenzofuran-1(3H)-one (cyanate of phenolphthalein), 3,3-bis(4-cyanato-3-methylphenyl)isobenzofuran-1(3H)-one (cyanate of o-cresolphthalein), 9,9-bis(4-cyanatophenyl)fluorene, 9,9-bis(4-cyanato-3-methylphenyl)fluorene, 9,9-bis(2-cyanato-5-biphenylyl)fluorene, tris(4-cyanatophenyl)methane, 1,1,1-tris(4-cyanatophenyl)ethane, 1,1,3-tris(4-cyanatophenyl)propane, α,α,α'-tris(4-cyanatophenyl)-1-ethyl-4-isopropylbenzene, 1,1,2,2-tetrakis(4-cyanatophenyl)ethane, tetrakis(4-cyanatophenyl)methane, 2,4,6-tris(N-methyl-4-cyanatoanilino)-1,3,5-triazine, 2,4-bis(N-methyl-4-cyanatoanilino)-6-(N-methylanilino)-1,3,5-triazine, bis(N-4-cyanato-2-methylphenyl)-4,4-oxydiphthalimide, bis(N-3-cyanato-4-methylphenyl)-4,4-oxydiphthalirnide, bis(N-4-cyanatophenyl)-4,4-oxydiphthalimide, bis(N-4-cyanato-2-methylphenyl)-4,4-(hexafluoroisopropylidene) diphthalimide, tris(3,5-dimethyl-4-cyanatobenzyl) isocyanurate, 2-phenyl-3,3-bis(4-cyanatophenyl) phthalimidine, 2-(4-methylphenyl)-3,3-bis(4-cyanatophenyl)phthalimidine, 2-phenyl-3,3-bis(4-cyanato-3-methylphenyl)phthalimidine, 1-methyl-3,3-bis(4-cyanatophenyl)indoline-2-one, and 2-phenyl-3,3-bis(4-cyanatophenyl)indoline-2-one. Other specific examples of the compound represented by the above-described formula (5) include resins obtained by cyanation, in a similar manner to that described above, of phenolic resins, such as a phenol novolac resin or a cresol novolac resin (a resin obtained by reacting phenol, alkyl substituted phenol or halogen substituted phenol with a formaldehyde compound such as formalin or paraformaldehyde in an acidic solution by any of known methods), a trisphenol novolac resin (a resin obtained by reacting hydroxybenzaldehyde with phenol in the presence of an acidic catalyst), a fluorene novolac resin (a resin obtained by reacting a fluorenone compound with any of 9,9-bis(hydroxyaryl)fluorenes in the presence of an acidic catalyst), a furan ring-containing phenol novolac resin (a resin obtained by reacting furfural with phenol in the presence of a basic catalyst), a phenol aralkyl resin, a cresol aralkyl resin, a naphthol aralkyl resin, a binaphthol aralkyl resin and a biphenyl aralkyl resin (a resin obtained, by any of known methods, by reacting a bishalogenomethyl compound represented by $Ar_2$—$(CH_2Y)_2$ (wherein $Ar_2$ represents a phenyl group and Y represents a halogen atom; the same shall apply in this paragraph) with a phenolic compound in the presence of an acidic catalyst or in the absence of a catalyst, a resin obtained by reacting a bis(alkoxymethyl) compound represented by $Ar_2$—$(CH_2OR)_2$ with a phenolic compound in the presence of an acidic catalyst, a resin obtained by reacting a bis(hydroxymethyl) compound represented by $Ar_2$—$(CH_2OH)_2$ with a phenolic compound in the presence of an acidic catalyst, or a resin obtained by polycondensation of an aromatic aldehyde compound, an aralkyl compound and a phenolic compound), a phenol-modified xylene-formaldehyde resin (a resin obtained, by any of known methods, by reacting a xylene-formaldehyde resin with a phenolic compound in the presence of an acidic catalyst), a modified naphthalene formaldehyde resin (a resin obtained, by any of known methods, by reacting a naphthalene formaldehyde resin with a hydroxy-substituted aromatic compound in the presence of an acidic catalyst), a phenol-modified dicyclopentadiene resin, and a phenolic resin having a polynaphthylene ether structure (a resin obtained, by any of known methods, by dehydration condensation of a polyvalent hydroxynaphthalene compound having, in a molecule thereof, two or more phenolic hydroxy groups in the presence of a basic catalyst), and prepolymers of the resins thus obtained by cyanation. It is noted that these examples are not restrictive. One of these different cyanate ester compounds may be singly used, or two or more of these may be used in an appropriate combination.

Any of generally known maleimide compounds can be used as the maleimide compound as long as the compound has one or more maleimide groups in one molecule. Examples include, but are not limited to, 4,4-diphenylmethane bismaleimide, bis(3,5-dimethyl-4-maleimidephenyl) methane, bis(3-ethyl-5-methyl-4-maleimidephenyl)methane, bis(3,5-diethyl-4-maleimidephenyl)methane, phenylmethane maleimide, o-phenylene bismaleimide, m-phenylene bismaleimide, p-phenylene bismaleimide, o-phenylene biscitraconimide, m-phenylene biscitraconimide, p-phenylene biscitraconimide, 2,2-bis(4-(4-maleimidephenoxy)-phenyl)propane, 3,3-dimethyl-5,5-diethyl-4,4-diphenylmethane bismaleimide, 4-methyl-1,3-phenylene bismaleimide, 1,6-bismaleimide-(2,2,4-trimethyl)hexane, 4,4-diphenyl ether bismaleimide, 4,4-diphenylsulfone bismaleimide, 1,3-bis(3-maleimidephenoxy)benzene, 1,3-bis (4-maleimidephenoxy)benzene, 4,4-diphenylmethane biscitraconimide, 2,2-bis[4-(4-citraconimidephenoxy)phenyl] propane, bis(3,5-dimethyl-4-citraconimidephenyl)methane, bis(3-ethyl-5-methyl-4-citraconimidephenyl)methane, bis (3,5-diethyl-4-citraconimidephenyl)methane, polyphenylmethane maleimide, and a prepolymer of any of these maleimide compounds or a prepolymer of any of the maleimide compounds and an amine compound. One of these maleimide compounds may be singly used, or two or more of these may be used in an appropriate combination.

Any of generally known phenolic resins may be used as the phenolic resin as long as the resin has, in a molecule thereof, two or more hydroxy groups. Examples include, but are not limited to, a bisphenol A-based phenolic resin, a bisphenol E-based phenolic resin, a bisphenol F-based phenolic resin, a bisphenol S-based phenolic resin, a phenol novolac resin, a bisphenol A novolac-based phenolic resin, a glycidyl ester-based phenolic resin, an aralkyl novolac-based phenolic resin, a biphenyl aralkyl-based phenolic resin, a cresol novolac-based phenolic resin, a polyfunctional phenolic resin, a naphthol resin, a naphthol novolac resin, a polyfunctional naphthol resin, an anthracene-based phenolic resin, a naphthalene skeleton-modified novolac-based phenolic resin, a phenol aralkyl-based phenolic resin, a naphthol aralkyl-based phenolic resin, a dicyclopentadiene-based phenolic resin, a biphenyl-based phenolic resin, an alicyclic phenolic resin, a polyol-based phenolic resin, a phosphorus-containing phenolic resin, a polymerizable unsaturated hydrocarbon group-containing phenolic resin, and a hydroxyl group-containing silicone resin. One of these phenolic resins may be singly used, or two or more of these may be used in an appropriate combination.

The resin composition of the present embodiment may further contain at least one selected from the group consisting of an oxetane resin, a benzoxazine compound and a compound having a polymerizable unsaturated group, as long as the desired characteristics are not impaired.

Any of generally known oxetane resins may be used as the oxetane resin. Examples include, but are not limited to, oxetane, alkyl oxetanes such as 2-methyl oxetane, 2,2-dimethyl oxetane, 3-methyl oxetane and 3,3-dimethyl oxetane, 3-methyl-3-methoxymethyl oxetane, 3,3-di(trifluoromethyl)perfluorooxetane, 2-chloromethyl oxetane, 3,3-bis (chloromethyl)oxetane, biphenyl-based oxetane, OXT-101 (product name, manufactured by Toagosei Co., Ltd.) and OXT-121 (product name, manufactured by Toagosei Co., Ltd.). One of these oxetane resins may be singly used, or two or more of these may be used in an appropriate combination.

Any of generally known benzoxazine compounds may be used as the benzoxazine compound as long as the compound has, in one molecule thereof, two or more dihydrobenzoxazine rings. Examples include, but are not limited to, bisphenol A-based benzoxazine BA-BXZ (product name, manufactured by Konishi Chemical Ind. Co., Ltd.), bisphenol F-based benzoxazine BF-BXZ (product name, manufactured by Konishi Chemical Ind. Co., Ltd.), bisphenol S-based benzoxazine BS-BXZ (product name, manufactured by Konishi Chemical Ind. Co., Ltd.), and phenolphthalein-based benzoxazine. One of these benzoxazine compounds may be singly used, or two or more of these may be used in an appropriate combination.

As the compound having a polymerizable unsaturated group, generally known compounds can be used. Examples include, but are not limited to, vinyl compounds such as ethylene, propylene, styrene, divinylbenzene and divinyl biphenyl; (meth)acrylates of monohydric or polyhydric alcohols such as methyl (meth)acrylate, 2-hydroxyethyl (meth)acrylate, 2-hydroxypropyl (meth)acrylate, polypropylene glycol di(meth)acrylate, trimethylolpropane di(meth) acrylate, trimethylolpropane tri(meth)acrylate, pentaerythritol tetra(meth)acrylate and dipentaerythritol hexa(meth) acrylate; epoxy (meth)acrylates such as bisphenol A-based epoxy (meth)acrylate and bisphenol F-based epoxy (meth) acrylate; and benzocyclobutene resins. One of these compounds having an unsaturated group may be singly used, or two or more of these may be used in an appropriate combination. It is noted that the term "(meth)acrylate" is used as a concept comprehensively referring to acrylate and corresponding methacrylate.

Besides, the resin composition of the present embodiment can be used together with any of various polymer compounds such as another thermosetting resins, thermoplastic resins, and oligomers and elastomers thereof, flame retardant compounds, various additives and the like as long as the desired characteristics are not impaired. These compounds are not especially limited as long as they are generally used. Examples of the flame retardant compounds include bromine compounds such as 4,4-dibromobiphenyl, nitride compounds such as phosphate ester, melamine phosphate, a phosphorus-containing epoxy resin, melamine and benzoguanamine, oxazine ring-containing compounds and silicone-based compounds. Besides, examples of the various additives include a UV absorber, an antioxidant, a photopolymerization initiator, a fluorescent brightener, a photosensitizer, a dye, a pigment, a thickener, a fluidity adjuster, a lubricant, an antifoaming agent, a dispersing agent, a leveling agent, a brightening agent and a polymerization inhibitor. One of these additives may be singly used, or two or more of these may be used in an appropriate combination.

The resin composition of the present embodiment can contain an organic solvent if necessary. In this case, the resin composition of the present embodiment can be used in a form in which at least a part, and preferably the whole, of the above-described respective resin components are dissolved or compatibilized in the organic solvent (namely, in the form of a solution or a vanish). Any of known organic solvents can be appropriately used as the organic solvent as long as the solvent can dissolve or compatibilize at least a part, and preferably the whole, of the above-described respective resin components, and the type is not especially limited. Examples of the organic solvent include ketones such as acetone, methyl ethyl ketone and methyl isobutyl ketone, cellosolve-based solvents such as propylene glycol monomethyl ether and propylene glycol monomethyl ether acetate, ester-based solvents such as ethyl lactate, methyl acetate, ethyl acetate, butyl acetate, isoamyl acetate, ethyl lactate, methyl methoxypropionate and methyl hydroxyisolactate, polar solvents such as amides including dimethylacetamide and dimethylformamide, and nonpolar solvents such as aromatic hydrocarbons including toluene and xylene. One of these solvents may be singly used, or two or more of these may be used in an appropriate combination.

A method for preparing the resin composition of the present embodiment is not especially limited as long as the resin composition containing the cyanate ester compound (A) and the epoxy resin (B) is prepared. For example, a method including dispersing the filler (C) in the epoxy resin (B) by a homomixer or the like, and adding the cyanate ester compound (A) thereto may be employed. Besides, an organic solvent is preferably added to the resin composition in order to lower the viscosity, improve the handling property and increase impregnation into a glass cloth.

The resin composition of the present embodiment can be used as a constituent material of a prepreg, a metal foil clad laminate, a printed circuit board, or a semiconductor package. For example, a prepreg can be obtained by dissolving the resin composition of the present embodiment in a solvent, impregnating or coating the resulting solution into or on a substrate, and drying the resultant.

Besides, when a peelable plastic film is used as a substrate, a solution obtained by dissolving the resin composition of the present embodiment in a solvent can be applied to the plastic film and then dried to thereby obtain a build-up film or a dry film solder resist. Here, the solvent can be dried by heating at a temperature of 20° C. to 150° C. for 1 to 90 minutes. Alternatively, the resin composition may be used in an uncured state attained merely by drying the solvent, or used in a semi-cured state (in a B-stage state) if necessary.

Now, a prepreg of the present embodiment will be described in detail. The prepreg of the present embodiment contains a substrate and the above-described resin composition impregnated into or coated on the substrate. A method for producing the prepreg of the present embodiment is not especially limited as long as the prepreg is produced through a combination of the resin composition of the present embodiment and a substrate. Specifically, the prepreg of the present embodiment can be produced by applying the resin composition of the present embodiment on the substrate or impregnating the composition into the substrate, and semicuring the resin composition by, for example, drying the resultant in a dryer at 120 to 220° C. for about 2 to 15 minutes. Here, an amount of the resin composition adhering to the substrate, namely, a content of the resin composition in the whole amount of the semi-cured prepreg (including the filler (C)), is preferably 20 to 99% by mass.

As the substrate used for producing the prepreg of the present embodiment, any of known substrates used for various printed circuit board materials may be used. Examples of such substrates include, but are not limited to, glass fibers of E-glass, D-glass, L-glass, S-glass, T-glass, Q-glass, UN-glass, NE-glass and spherical glass, inorganic fibers of quartz and the like not made of glass, organic fibers of polyimide, polyamide and polyester, and woven fabrics of liquid crystal polyester and the like. The form of the substrate can be any of known forms such as a woven fabric, a non-woven fabric, a roving, a chopped strand mat and a surfacing mat. One of these substrates may be singly used, or two or more of these may be used in an appropriate combination. Among woven fabrics, a woven fabric having been subjected to an ultra-opening treatment or a filling treatment in particular is suitably used from the viewpoint of dimensional stability. Besides, a glass woven fabric having been subjected to a surface treatment with a silane coupling agent, such as an epoxy silane treatment or an amino silane treatment, is preferably used from the viewpoint of the heat resistance after moisture absorption. Besides, a liquid crystal polyester fabric is preferred from the viewpoint of electric characteristics. Furthermore, the thickness of the substrate is not especially limited, but is preferably 0.01 to 0.2 mm for application to a laminate.

A metal foil clad laminate of the present embodiment includes a stack of at least one prepreg described above, and a metal foil disposed on one or both surfaces of the prepreg. Specifically, the metal foil clad laminate can be produced by laminate molding with a metal foil of copper, aluminum or the like disposed on one or both surfaces of one prepreg described above or a stack of a plurality of prepregs described above. The metal foil used here is not especially limited as long as the foil is used as a material of a printed circuit board, and is preferably a copper foil such as a roller copper foil or an electrolytic copper foil. Besides, the thickness of the metal foil is not especially limited, and is preferably 2 to 70 μm and more preferably 3 to 35 μm. As molding conditions, any of methods employed for production of a laminate or multilayer board for a general printed circuit board can be employed. The metal foil clad laminate of the present embodiment can be produced, for example, by performing the laminate molding using a multi-stage press, a multi-stage vacuum press, a continuous molding machine or an autoclave molding machine under conditions of a temperature of 180 to 350° C., a heating time of 100 to 300 minutes, and a contact pressure of 20 to 100 kg/cm². Alternatively, a multilayer board can be produced by performing the laminate molding on a combination of the above-described prepreg and an inner layer wiring board separately produced. A multilayer board is produced, for example, by performing the laminate molding under the above-described conditions with a copper foil of 35 μm disposed on each of both surfaces of one prepreg described above. Thereafter, an inner layer circuit is formed, and the circuit is subjected to a blackening treatment to form an inner layer circuit board. Besides, the thus obtained inner layer circuit board and the above-described prepreg are alternately disposed, and with a copper foil disposed on the outermost layer, the laminate molding is performed under the above-described conditions preferably under vacuum. In this manner, the multilayer board can be produced.

The metal foil clad laminate of the present embodiment can be suitably used as a printed circuit board when a desired wiring pattern is formed thereon. The printed circuit board can be produced by the usual method, and the production method is not especially limited. An example of the method for producing a printed circuit board will now be described. First, the above-described metal foil clad laminate is provided. Then, an inner layer plate is produced by etching a surface of the metal foil clad laminate to form an inner layer circuit. A surface of the inner layer circuit of the inner layer plate is surface treated for improving adhesion strength if necessary, and thereafter, a desired number of prepregs described above are stacked on the surface of the inner layer circuit. A metal foil for an outer layer circuit is further stacked on the outside thereof, and the resultant is integrally molded by heating and pressing. In this manner, a multilayer laminate including, between the inner layer circuit and the metal foil for the outer layer circuit, a substrate and an insulating layer formed of a cured product of a thermosetting resin composition is produced. Subsequently, the multilayer laminate is subjected to drilling process for forming through holes and via holes, and a plating metal film for electrically connecting the inner layer circuit and the metal foil for the outer layer circuit is formed on walls of the holes. Besides, the metal foil for the outer layer circuit is etched to form an outer layer circuit, and thus, a printed circuit board is produced.

The printed circuit board produced by the above-described example of the production method includes the insulating layer and a conductor layer formed on a surface of the insulating layer, and the insulating layer contains the resin composition of the present embodiment described above. Specifically, the prepreg (namely, the substrate and the resin composition of the present embodiment impregnated into or applied on the substrate) of the present embodiment, and a layer of the resin composition of the metal foil clad laminate of the present embodiment (namely, a layer of the resin composition of the present embodiment) are constituted by the insulating layer containing the resin composition of the present embodiment.

A resin composite sheet of the present embodiment includes a support and the above-described resin composition disposed on a surface of the support. The resin composite sheet can be obtained by applying, onto the support, a solution of the resin composition dissolved in a solvent, and drying the resultant. Examples of the support used herein include, but are not limited to, a polyethylene film, a polypropylene film, a polycarbonate film, a polyethylene terephthalate film, an ethylene-tetrafluoroethylene copolymer film, a release film obtained by applying a release agent onto a surface of any of these films, an organic film substrate of a polyimide film, a conductive foil such as a copper or aluminum foil, a glass plate, a SUS plate and an FRP plate. As an application method, for example, a method in which a solution of the resin composition of the present embodiment dissolved or compatibilized in a solvent is applied onto the support by a bar coater, a die coater, a doctor blade, a Baker applicator or the like may be employed. Besides, after the application and drying, the support can be peeled off or etched from the resin composite sheet to obtain a single-layer sheet (a resin sheet). Incidentally, a single-layer sheet (a resin sheet) can be obtained, without using a support, by supplying, into a mold having a sheet-shaped cavity, a solution of the resin composition of the present embodiment dissolved or compatibilized in a solvent, and drying the resultant to mold the solution into the shape of a sheet.

In the production of the resin composite sheet or the single-layer sheet of the present embodiment, the drying conditions for removing the solvent are not especially limited, but the solvent is preferably dried at a temperature of 20° C. to 200° C. for 1 to 90 minutes. If the temperature is 20° C. or higher, the solvent is more definitely prevented from remaining in the resin composition, and if the temperature is 200° C. or lower, the curing of the resin composition can be more definitely inhibited. Besides, the thickness of the resin layer in the resin composite sheet or the single-layer sheet of the present embodiment is not especially limited, and can be controlled in accordance with the concentration of the solution of the resin composition of the present embodiment and an application thickness. The thickness is, however, preferably 0.1 to 500 μM. If the thickness of the resin layer is 500 μm or less, the solvent is more difficult to remain after drying.

EXAMPLES

The present invention will now be described in more detail with reference to a synthesis example, an example and comparative examples, but it is noted that the present invention is not limited by these examples.

(Measurement of Hydroxy Group (Hereinafter Referred to as "OH Group") Equivalent (g/Eq.) of Hydroxyl Group-Containing Aromatic Compound)

An OH group equivalent (g/eq.) of a hydroxyl group-containing aromatic compound was obtained by a pyridine-acetyl chloride method in accordance with JIS-K0070.

(Measurement of Weight Average Molecular Weight Mw of Cyanate Ester Compound)

Ten μL of a solution in which 1 g of a cyanate ester compound was dissolved in 100 g of tetrahydrofuran (a solvent) was injected into a high performance liquid chromatograph (high performance liquid chromatograph manufactured by Hitachi High-Technologies Corporation, product name "LachromElite") for performing analysis. Two columns manufactured by Tosoh Corporation under a product name "TSKgel $GMH_{HR}$-M" (length of 30 cm×inner diameter of 7.8 mm) were used, and tetrahydrofuran was used as a mobile phase. A flow rate of a sample in the columns was set to 1 mL/min., and an RI (refractive index) detector was used as a detector. A weight average molecular weight Mw was obtained by GPC using a polystyrene standard.

(Synthesis Example 1) Synthesis of Cyanate Ester Compound 1 (Hereinafter Abbreviated as "MF27S-3-CN") of Naphthol-Dihydroxynaphthalene Aralkyl Resin MF27S-3-CN represented by the following formula (1) and/or the following formula (2) was synthesized as described below.

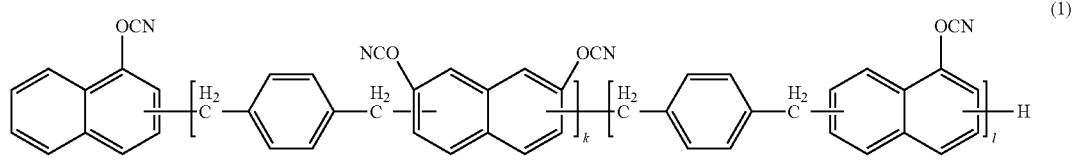

wherein k represents an integer of 1 to 20, and l represents an integer of 0 to 20. This compound may be a mixture of compounds different in k and l. The arrangement of repeating units is arbitrary.

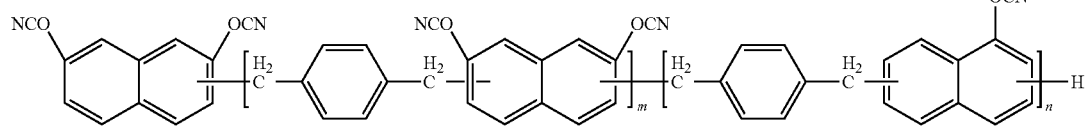

wherein m and n each represent an integer of 0 to 20, with at least one of m and n representing 1 or more. This compound may be a mixture of compounds different in m and n. The arrangement of repeating units is arbitrary.

<Synthesis of Naphthol-Dihydroxynaphthalene Aralkyl Resin 1 (Hereinafter Abbreviated as "MF27S-3-OH")>

First, MF27S-3-OH represented by the following formula (3) and/or the following formula (4) was synthesized.

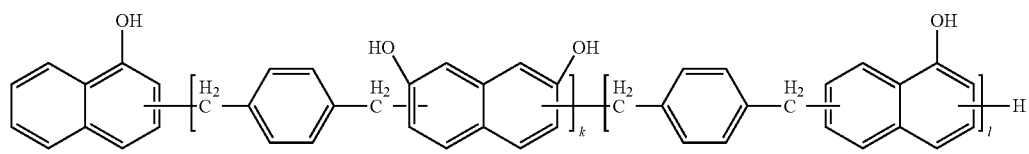

wherein k represents an integer of 1 to 20, and l represents an integer of 0 to 20. This compound may be a mixture of compounds different in k and l. The arrangement of repeating units is arbitrary.

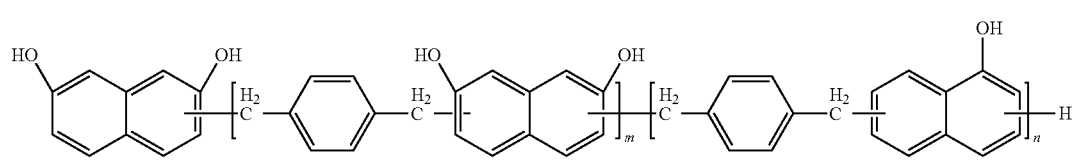

wherein m and n each represent an integer of 0 to 20, with at least one of m and n representing 1 or more. This compound may be a mixture of compounds different in m and n. The arrangement of repeating units is arbitrary.

Specifically, a reactor was charged with 372.0 g (2.58 mol) of 1-naphthol and 177.4 g (1.11 mol) of 2,7-dihydroxynaphthalene, followed by stirring at 150° C. for dissolution. Subsequently, 0.17 g of paratoluenesulfonic acid was added into the reactor, and while increasing the temperature to 170° C. over 1 hour, 299.2 g (1.80 mol) of 1,4-bis(methoxymethyl)benzene was added thereto in a dropwise manner. Thereafter, with methanol and generated water extracted from the reactor, the reaction was allowed to proceed at 170° C. for 3 hours. After the reaction was completed, the resultant reaction mixture was diluted with 1000 g of a mixed solvent (meta-xylene/MIBK=1/1 (in a volume ratio)), and the resultant was washed with water to remove the catalyst from the reaction mixture. Besides, an unreacted portion of the materials and the mixed solvent were removed from the reaction mixture by steam distillation and vacuum distillation, and thus, 599 g of MF27S-3-OH was obtained. The OH equivalent of the thus obtained MF27S-3-OH was 174 g/eq.

<Synthesis of MF27S-3-CN>

Next, 500 g of the MF27S-3-OH (OH group equivalent: 174 g/eq., 2.87 mol in terms of OH group, weight average molecular weight Mw: 760) obtained as described above and 436.2 g (4.31 mol, 1.5 mol per mole of OH group of MF27S-3-OH) of triethylamine were dissolved in 3000 g of dichloromethane, and the resultant solution was used as a solution 1.

In a reactor, 300.3 g (4.89 mol, 1.7 mol per mole of OH group of MF27S-3-OH) of cyanogen chloride, 700.7 g of dichloromethane, 465.6 g (4.60 mol, 1.6 mol per mole of OH group of MF27S-3-OH) of 36% hydrochloric acid and 2887 g of water were mixed, and the solution 1 was poured into the reactor over 70 minutes under stirring with the temperature kept at −2 to −0.5° C. After the pour of the solution 1 was completed, the resultant content of the reactor was stirred at the same temperature for 30 minutes, and thereafter, a solution obtained by dissolving 174.5 g (1.72 mol, 0.6 mol per mol of OH group of the MF27S-3-OH) of triethylamine in 14.6 g of dichloromethane (hereinafter referred to as the "solution 2") was poured into the reactor over 25 minutes. After the pour of the solution 2 was completed, the resultant content of the reactor was stirred at the same temperature for 30 minutes to complete the reaction.

Thereafter, the thus obtained reaction solution in the reactor was allowed to stand still to separate an organic phase and an aqueous phase. The thus obtained organic phase was washed with 2 L of 0.1 N hydrochloric acid, and then washed with 2000 g of water six times. The water wasted in the sixth washing was found to have electrical conductivity of 20 µS/cm, and thus, it was confirmed that ionic compounds removable through the washing with water had been sufficiently removed.

The organic phase having been washed with water was concentrated under reduced pressure, and was ultimately concentrated and dried at 90° C. for 1 hour to obtain 570 g of the cyanate ester compound MF27S-3-CN (a dark purple viscous substance) of interest. The obtained MF27S-3-CN had a weight average molecular weight Mw of 980. Besides, the MF27S-3-CN had an IR spectrum showing absorption of a cyanato group at 2264 $cm^{-1}$, and showing no absorption of a hydroxy group.

Example 1

Fifty parts by mass of the MF27S-3-CN obtained in Synthesis Example 1, 50 parts by mass of a biphenyl aralkyl-based epoxy resin (product name "NC-3000-FH", manufactured by Nippon Kayaku Co., Ltd.) and 100 parts by mass of fused silica (product name "SC2050 MB", manufactured by Admatechs Co., Ltd.) were mixed to obtain a varnish. The thus obtained varnish was diluted with methyl ethyl ketone, the resultant was impregnation coated on an E-glass fabric having a thickness of 0.1 mm, and the resultant was heated and dried at 150° C. for 5 minutes to obtain a prepreg having a resin content of 50% by mass.

Four or eight prepregs each obtained as described above were stacked, and with an electrolytic copper foil having a thickness of 12 µm (product name "3EC-M3-VLP", manufactured by Mitsui Mining and Smelting Co., Ltd.) provided on both sides thereof in the stacking direction, the laminate molding was performed at a pressure of 30 $kgf/cm^2$ and a temperature of 220° C. for 120 minutes, and thus, a copper clad laminate (a metal foil clad laminate) having an insulating layer thickness of 0.4 mm or 0.8 mm was obtained. The thus obtained copper clad laminate was used for evaluating the glass transition temperature, the flame retardancy and the heat resistance after moisture absorption. The results are shown in Table 1.

(Measurement Methods and Evaluation Methods)
1) Glass Transition Temperature (Tg)
The copper clad laminate (using the eight prepregs) obtained as described above was measured for a glass transition temperature in accordance with JIS C6481 by a DMA method using a dynamic viscoelasticity analyzer (manufactured by TA Instruments).
2) Flame Retardancy
The copper clad laminate (using the four prepregs) obtained as described above was evaluated for the flame retardancy in accordance with a UL94 vertical burn test after removing the copper foils from the copper clad laminate.

3) Heat Resistance after Moisture Absorption
The copper clad laminate (using the four prepregs) obtained as described above was cut into a size of 50 mm×50 mm, and the copper foils excluding a half portion thereof disposed on one of the surfaces were removed by etching to obtain a test piece. The thus obtained test piece was treated by a pressure cooker testing machine (PC-3 type, manufactured by Hirayama Manufacturing Corporation) at 121° C. and 2 atm for 5 hours, and then, the resultant was immersed in a solder bath at 260° C. for 60 seconds to visually observe the change in appearance occurring thereafter. The heat resistance after moisture absorption was evaluated on the basis of a ratio of the number of test pieces in which a swell was caused to the number of all test pieces tested.

Comparative Example 1

A copper clad laminate having a thickness of 0.4 mm or 0.8 mm was obtained in the same manner as in Example 1 except that 50 parts by mass of the MF27S-3-CN was replaced with 50 parts by mass of a bisphenol A-based cyanate ester compound (product name "CA210", manufactured by Mitsubishi Gas Chemical Company Inc.). The evaluation results of the thus obtained copper clad laminate are shown in Table 1.

Comparative Example 2

A copper clad laminate having a thickness of 0.4 mm or 0.8 mm was obtained in the same manner as in Example 1 except that 50 parts by mass of the MF27S-3-CN was replaced with 50 parts by mass of a phenol novolac-based cyanate ester compound (product name "Primaset PT-30", manufactured by Lonza Japan Co., Ltd.). The evaluation results of the thus obtained copper clad laminate are shown in Table 1.

TABLE 1

|  |  | Example 1 | Comparative Example 1 | Comparative Example 2 |
|---|---|---|---|---|
| Glass Transition Temperature | (° C.) | 293 | 262 | 280 |
| Flame Retardancy |  | V-0 | V-1 | V-1 |
| Heat resistance after moisture absorption | After treating for 5 hours | 0/4 | 3/4 | 1/4 |

As is obvious from Table 1, it was confirmed that a prepreg and the like capable of realizing a printed circuit board that is excellent not only in the heat resistance and the flame retardancy but also in the heat resistance after moisture absorption can be realized by using the resin composition of the present invention.

This application is based upon the prior Japanese patent application (Japanese Patent Application No. 2015-072691) filed on Mar. 31, 2015, the entire contents of which are incorporated herein by reference.

INDUSTRIAL APPLICABILITY

A resin composition of the present invention can be widely and effectively used in various applications including electric/electronic materials, machine tool materials, aviation materials and the like as, for example, an electrical insulating material, a semiconductor plastic package, a sealing material, an adhesive, a laminate material, a resist, a build-up laminate material and the like. Above all, the resin composition of the present invention is particularly effectively used as a printed circuit board material applicable to high degrees of integration and density of recent information terminal equipment or communication devices. Besides, a metal foil clad laminate and the like of the present invention have not only heat resistance and flame retardancy but also excellent performance in heat resistance after moisture absorption, and therefore, the industrial applicability of the present invention is extremely high.

The invention claimed is:

1. A resin composition for a printed circuit board, comprising a cyanate ester compound (A) having at least one structure selected from the group consisting of structures represented by the following formula (1), the following formula (2) and the following formula (8), and an epoxy resin (B):

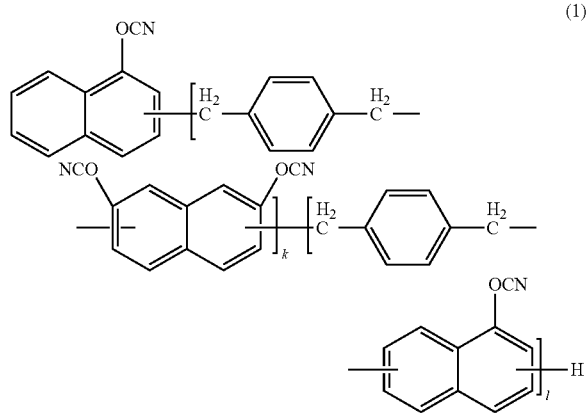

(1)

wherein k represents an integer of 1 or more, and l represents an integer of 0 or more, the cyanate ester compound optionally being a mixture of compounds different in k and l, and arrangement of repeating units being arbitrary,

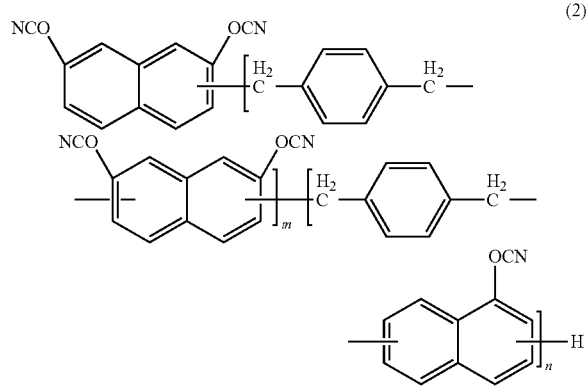

(2)

wherein m and n each represent an integer of 0 or more, at least one of m and n being 1 or more, the cyanate ester compound optionally being a mixture of compounds different in m and n, and arrangement of repeating units being arbitrary, and

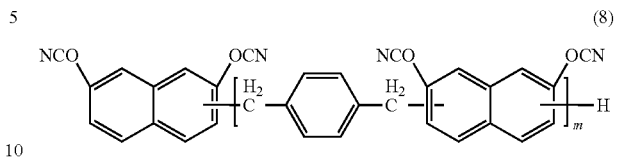

(8)

wherein m represents an integer of 0 or more, and the cyanate ester compound being a mixture of compounds different in m.

2. The resin composition for a printed circuit board according to claim 1, wherein the cyanate ester compound (A) is one obtained by cyanation of at least one resin selected from the group consisting of naphthol-dihydroxynaphthalene aralkyl resins and dihydroxynaplthalene aralkyl resins.

3. The resin composition for a printed circuit board according to claim 1, wherein a content of the cyanate ester compound (A) is 1 to 90 parts by mass based on 100 parts by mass of a solid content of resins contained in the resin composition.

4. The resin composition for a printed circuit board according to claim 1, further comprising a filler (C).

5. The resin composition for a printed circuit board according to claim 4, wherein a content of the filler (C) is 50 to 1600 parts by mass based on 100 parts by mass of a solid content of resins contained in the resin composition.

6. The resin composition for a printed circuit board according to claim 1, further comprising at least one selected from the group consisting of a cyanate ester compound other than the cyanate ester compound (A), maleimide compounds and phenolic resins.

7. The resin composition for a printed circuit board according to claim 1, wherein the epoxy resin (B) is at least one selected from the group consisting of biphenyl aralkyl-based epoxy resins, naphthylene ether-based epoxy resins, polyfunctional phenol-based epoxy resins and naphthalene-based epoxy resins.

8. A prepreg comprising:
   a substrate; and
   the resin composition for a printed circuit board according to claim 1 impregnated into or applied to the substrate.

9. A metal foil clad laminate comprising:
   at least one prepreg according to claim 8 stacked; and
   a metal foil disposed on one surface or both surfaces of the prepreg.

10. A resin composite sheet comprising:
    a support; and
    the resin composition for a printed circuit board according to claim 1 disposed on a surface of the support.

11. A printed circuit board comprising an insulating layer and a conductive layer formed on a surface of the insulating layer,
    wherein the insulating layer comprises the resin composition for a printed circuit board according to claim 1.

* * * * *